United States Patent [19]
Moran et al.

[11] Patent Number: 5,533,197
[45] Date of Patent: Jul. 2, 1996

[54] METHOD TO ASSESS ELECTROMIGRATION AND HOT ELECTRON RELIABILITY FOR MICROPROCESSORS

[75] Inventors: David E. Moran, South Burlington; Timothy J. O'Gorman, Williston; Kimball M. Watson, Essex Junction, all of Vt.

[73] Assignee: International Business Machines Corporation, Armonk, N.Y.

[21] Appl. No.: 327,151

[22] Filed: Oct. 21, 1994

[51] Int. Cl.$^6$ .................................... G06F 11/00
[52] U.S. Cl. .................. 395/185.08; 395/183.16
[58] Field of Search .................... 395/185.08, 185.01, 395/183.09, 183.16, 183.13, 550; 371/61, 62; 324/535, 500

[56] References Cited

U.S. PATENT DOCUMENTS

| | | | |
|---|---|---|---|
| 4,166,280 | 8/1979 | Poole | 358/51 |
| 4,642,492 | 2/1987 | Beck et al. | 307/578 |
| 4,928,062 | 5/1990 | Miles et al. | 324/158 R |
| 5,198,884 | 3/1993 | Yano et al. | 257/760 |
| 5,208,765 | 5/1993 | Turnbull | 364/552 |
| 5,252,382 | 10/1993 | Li | 428/209 |
| 5,278,769 | 1/1994 | Bair et al. | 364/490 |
| 5,296,401 | 3/1994 | Mutsui et al. | 437/57 |
| 5,306,655 | 4/1994 | Kurimoto | 437/44 |
| 5,383,194 | 1/1995 | Slaon et al. | 371/22.1 |

OTHER PUBLICATIONS

Jeuland et al., "Geometry–Induced Electromigration Degradations in AISI Narrow Interconnects", IEEE VMIC Conf. pp. 399–401.

Burch et al. "Pattern Independent Current Estimation for Reliability Analysis of CMOS Circuits", 25th ACM Conf. 1988 IEEE, pp. 294–299.

Najm, "Transistion Density: A New Measure of Activity in Digital Circuits", 1992 IEEE, pp. 310–323.

Yamada et al., "Process Performance, and Reliability Characterization of a GaAs VLSI Technology", 1993 IEEE pp. 107–110.

Primary Examiner—Robert W. Beausoliel, Jr.
Assistant Examiner—Joseph E. Palys
Attorney, Agent, or Firm—Calfee Halter & Griswold

[57] ABSTRACT

A method of assessing the tolerance of a microprocessor to propagation time degradation caused by electromigration effects and hot electron effects is provided. Reference values for interconnection resistance (IR) degradation and drain current (DC) degradation are compute, at nominal fabrication process and microprocessor lifetime application conditions. These results may be tabulated for a plurality of output driver load capacitances. Test IR degradation and test DC degradation values are calculated by scaling the reference IR and DC degradation values, respectively, for actual test conditions. The circuit propagation time and the propagation delay degradation caused by both electromigration and hot electron effects are calculated at process and lifetime environmental conditions. A timing equation is evaluated using distinctly identified components of the propagation delay degradation caused by electromigration and hot electron effects, to assess the toleration of the microprocessor to electromigration and hot electron induced propagation delay degradation.

12 Claims, 6 Drawing Sheets

METHOD TO ASSESS ELECTROMIGRATION AND HOT ELECTRON RELIABILITY FOR MICROPROCESSORS

FIELD OF INVENTION

The present invention relates generally to microprocessor reliability analysis methods, and more particularly to methods for assessing microprocessor reliability while accounting for circuit propagation time degradation caused by electromigration and the hot electron effect.

BACKGROUND

Complementary metal oxide semiconductor (CMOS) microprocessors typically comprise one or more integrated circuit (IC) chips. Each IC chip includes thousands and perhaps millions of n-type field effect transistors (NFETS) and p-type field effect transistors (PFETS) which are used to construct memory arrays, latches, and other combinatorial logic elements. These circuits must reliably store or process data during every microprocessor cycle ($t_{cycle}$) over the lifetime ($\delta$) of the microprocessor.

The term electromigration (EM) refers to the transport of mass in metals when stressed to high current densities. EM occurs during the passage of direct current (DC) through thin metal conductors in integrated semiconductor integrated circuits, and results in accumulation of metal in some regions and voids in other regions. EM in extreme cases may be catastrophic with respect to circuit performance if either (i) accumulations become so severe as to bridge adjacent conductors, thereby causing short circuits, or (ii) voids become so severe as to cause open circuits. Such occasions are referred to as catastrophic faults.

Less catastrophic results (intermittent faults), but nonetheless problematic, results are possible due to partial void formation. Partial void formation causes changes in the interconnection resistance between transistors in the microprocessor circuit over time (see, e.g. A van der Ziel, "Two Different Methods of Determining Electromigration Parameters Associated with Resistance Change", *Solid State Electronics*, Vol 33, No. 8, pp 1025–1027 (1990)). This time dependent interconnection resistance degradation ($\Delta R_{int}(\tau))/R_{int}$ is proportional to circuit propagation time degradation $\Delta t_{pd}(\tau)/t_{pd}$, because the time it takes for signals to traverse the interconnection paths between interconnected transistors depends on the interconnection resistance. Accordingly, EM effects which degrade interconnection resistance also degrade circuit propagation time. The circuit propagation time degradation $\Delta t_{pd}(\tau)/t_{pd}$, in turn, may result in intermittent timing-faults, and reduce microprocessor reliability over circuit lifetime ($\delta$) (Krautschneider, et al., "Reliability Problems of Submicron MOS Transistors and Circuits", *Microelectron Reliability*, Vol 32, No. 11, pp 1499–1508, (1992)). Both time dependent interconnection resistance degradation ($\Delta R_{int}(\tau))/R_{int}$, and circuit propagation time degradation $\Delta t_{pd}(\tau)/t_{pd}$ are dependent on manufacturing process variations, circuit design, and microprocessor application factors of temperature, voltage and lifetime.

The term hot-electron (HE) effect refers to the phenomenon of electrons which originate from FET surface channel currents, from impact ionization currents at the FET drain junction, or from substrate leakage currents. Electrons drifting from the gate may gain sufficient energy to enter into the gate, or they may collide with the silicon atoms and generate electron-hole pairs. The hole adds to substrate current, and the secondary electron may be injected into the gate of a subsequent FET (see e.g., M. Annaratone, H.B. *Digital CMOS Circuit Design*, Kluwer Academic Publishers, Norwell Mass., p. 39, (1986)). As these secondary electrons accumulate in the gate, the FET threshold voltage shifts and the internal resistance of the device changes. Device current $I_d$ is proportional to both the internal resistance of the device and $(V_{GS}-V_T)^2$. Therefore, as the threshold voltage $V_T$ and the internal resistance changes, the current drive capability $I_d$ of the device changes. This time dependent, drain current degradation $\Delta I_d(\tau)/I_d$ must be less than 0.1 according to conventional hot-electron reliability criteria.

Drain current degradation $\Delta I_d(\tau)/I_d$ is a wear-out effect which reduces circuit reliability, because it also causes changes in circuit propagation time $\Delta t_{pd}(\tau)$, which may result in intermittent timing-faults. Variances in the circuit propagation time, $\Delta t_{pd}(\tau)/t_{pd}$, which are caused by this hot electron-induced drain current degradation effect, and the resulting changes in device internal resistance, are proportional to the time dependent drain current degradation $\Delta I_d(\tau)/I_d$, which reduces microprocessor reliability over circuit lifetime ($\delta$). Time dependent drain current degradation $\Delta I_d(\tau)/I_d$ and circuit propagation time degradation $\Delta t_{pd}(\tau)/t_{pd}$ are dependent on manufacturing process variations, circuit design, and microprocessor application factors of temperature, voltage and lifetime.

The hot electron and EM effects on propagation degradation are considered during circuit level design for each transistor (hot electron effect) and each transistor interconnect (EM effect) (see, e.g.T.J. O'Gorman, ADCHECK Circuit Reliability Program, IBM Microelectronics Division, May, 1994). The problem is that circuit-level analysis does not include the manner in which hot electron and EM effects are subsequently influenced by fabrication process variation, global wiring, and application factors such as temperature, voltage, and lifetime, or how these factors would be combined to optimize parametric yield.

Accordingly, when assessing microprocessor reliability, circuit designers must attempt to determine time dependent interconnection resistance degradation $\Delta R_{int}(\tau))/R_{int}$, as well as time dependent drain current degradation $\Delta I_d(\tau)/I_d$. Because both of these terms are proportional to variances in circuit propagation time $\Delta t_{pd}(\tau)/t_{pd}$, the circuit designer may assess both interconnection resistance degradation and drain current degradation by analyzing $\Delta t_{pd}(\tau)/t_{pd}$. Circuit propagation time degradation which is caused by EM and hot electron effects may then be used to determine if a particular circuit satisfies established timing criteria. In doing so, designers insure proper timing and amplitude of data and control signals propagating through the circuit, by insuring that the microprocessor may tolerate circuit propagation time degradation $\Delta t_{pd}(\tau)/t_{pd}$ caused by both electromigration and hot electron effects.

SUMMARY

The present invention provides a means of assessment for time dependent interconnection resistance degradation, and time dependent drain current degradation, which accounts for manufacturing process variations, circuit design, and microprocessor application factors such as operating temperature, supply voltage and expected lifetime. The present invention is implemented in the form of a software analysis tool which may be used to assess the EM and hot electron reliability of a circuit. Reliability may be assessed across all of the circuits in an IC microprocessor chip, instead of merely at the circuit-level. The need to assess EM reliability may arise from a new design reliability audit, a change in technology standards, or an environmental use study.

In order to test microprocessor tolerance to propagation delay degradation caused by electromigration and hot electron effects, a reference interconnection resistance degradation and a reference drain current degradation must be computed at nominal fabrication process and microprocessor lifetime application conditions. The results of these computations are tabulated for a plurality of output driver load capacitances. A test interconnection resistance degradation and a test drain current degradation are then computed by scaling the reference values previously obtained to account for actual test conditions using actual process and lifetime environmental conditions.

Next, the circuit propagation time under these process and lifetime environmental conditions is calculated using known microprocessor logic and physical design data. The propagation delay degradation is calculated under these process, and lifetime environmental conditions while accounting for both electromigration and hot electron effects. The microprocessor tolerance to both the hot-electron and electromigration components of the induced propagation degradation is assessed using a timing equation which must be satisfied by the circuit design. Any circuits which violate timing equation may be redesigned and retested using this inventive method of analysis.

DETAILED DESCRIPTION OF A PREFERRED EMBODIMENT

Figure 1:
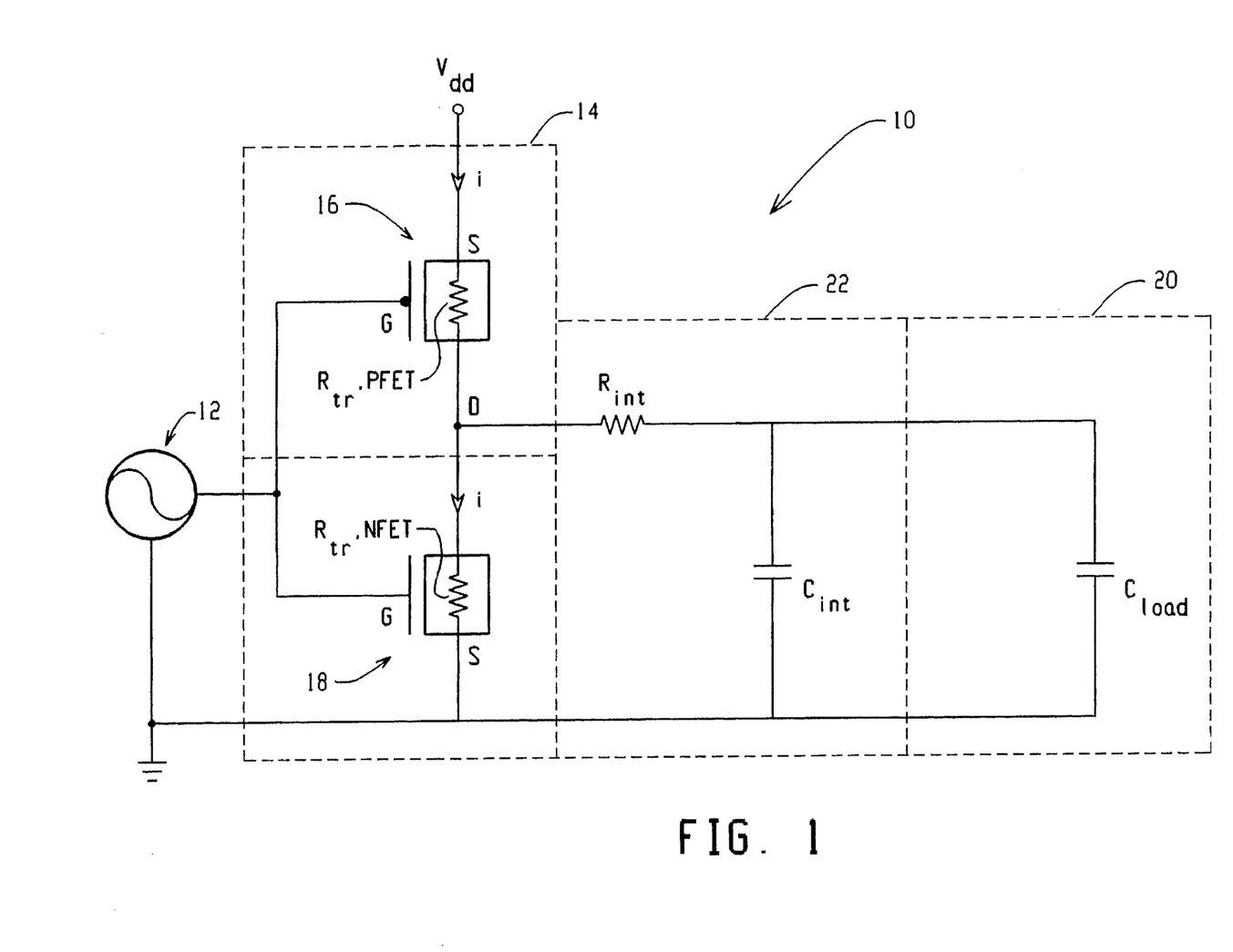
FIG. 1 (is a simplified circuit schematic of a microprocessor chip, the reliability of which may be tested by the present inventive method.

FIG. 1 represents a simplified circuit schematic of a microprocessor chip 10. A particular microprocessor may be made up of one or more of these chips 10, each of which may include millions of NFETS and PFETS, which form, for example, inverters and other logic elements or memory array elements. As shown in FIG. 1, the simplified microprocessor chip includes a digital signal generator 12 which operates at a predetermined frequency. The clock cycle corresponding to this frequency is referred to as the processor cycle time ($t_{cycle}$).

The output of the signal generator 12 is a digital signal of varying amplitude and frequency which is sent to the gate of a CMOS inverter 14. The CMOS inverter 14 comprises a PFET 16 and NFET 18 the gates and drains of which are tied together. $R_{tr,PFET}$ represents the internal resistance of the PFET and $R_{tr,NFET}$ represents the internal resistance of the NFET. $R_{tr}$ as used later herein equals the electrical combination of $R_{tr,PFET}$ and $R_{tr,NFET}$.

$V_{dd}$ is the power supply voltage for the inverter. The directions of current in the PFET and NFET of the inverter 14 which result from $V_{dd}$ are shown by the arrows labeled i. The NFET and PFET alternatively conduct through the $t_{cycle}$ of the signal generator 12. First, during the first half of the cycle, when PFFT 16 conducts, current flows from the power supply $V_{dd}$ through the PFET, and on through to $R_{int}$ and $C_{load}$, where it accumulates (the charge path). During the second half of the cycle, this accumulated charge flows through $R_{int}$ and NFET 16 to ground (the discharge path). The drain current $I_d$ of the inverter 14 is the average of these two current flows, and is represented in the following formulae in terms of amps.

The output of the inverter 14 is sent to another circuit 20, which may be another inverter PFET/NFET pair, logic element or memory array element. The circuit 20 is represented as a capacitive load $C_{load}$. An interconnection path 22 connects the output of the inverter 14 to the input of the circuit 20. The interconnection path is represented by the interconnection resistance $R_{int}$ and an interconnection capacitance $C_{int}$. Changes in transistor resistance $R_{tr}$ are caused by EM effects and may be represented as a function of time (τ) with respect to EM effects. Changes in interconnection resistance $R_{int}$ are caused by hot electron effects and may be represented as a function of time (τ) with respect to hot electron effects.

The lifetime δ of the microprocessor chip 10 is equal to the total number of $t_{cycle}$ periods which the microprocessor is expected to provide. Microprocessor lifetime δ equals the sum of the microprocessor burn-in time ($τ_{burn-in}$) and field time ($τ_{field}$) operation of the chip. The cycle time of a circuit for each $t_{cycle}$ must satisfy the criteria: $t_{cycle} \geq \Sigma t_{pd} + B$, where $t_{pd}$=circuit propagation time for a given interconnection path and B=set-up, hold, and clock variation times (i.e. slack time) allotted for that path. In other words, ignoring the hot electron and EM effects on the circuit propagation time, the cycle time must be at least as great as the sum of circuit propagation time and the allotted slack time. In this manner, the proper design of a circuit insures that data and clock signals launched from a first logic circuit (e.g. inverter 14) may propagate through combinatorial logic and be captured at the next logic circuit by the occurrence of the next clock signal.

The tolerance of a microprocessor chip to withstand any circuit propagation time degradation, $\Delta t_{pd}(τ)/t_{pd}$, and thus its tolerance to withstand both interconnection resistance degradation caused by electromigration and drain current degradation caused by the hot electron effect, is assessed using the criteria:

$$t_{cycle} - \Sigma [t_{pd} \pm \Delta t_{pd}(τ)] - B > 0 \qquad \{eq.1\}.$$

According to equation 1, the $t_{cycle}$ time must be greater than the sum of (i) the slack time allotted for an interconnection path and (ii) the circuit propagation time for that path, which accounts for circuit propagation time degradation $\Delta t_{pd}(τ)$ due to both electromigration and hot electron effects. If it is not, timing equation 1 is violated. Equation 1, then, may be used to assess a microprocessor's tolerance to circuit propagation time degradation.

Figure 2:
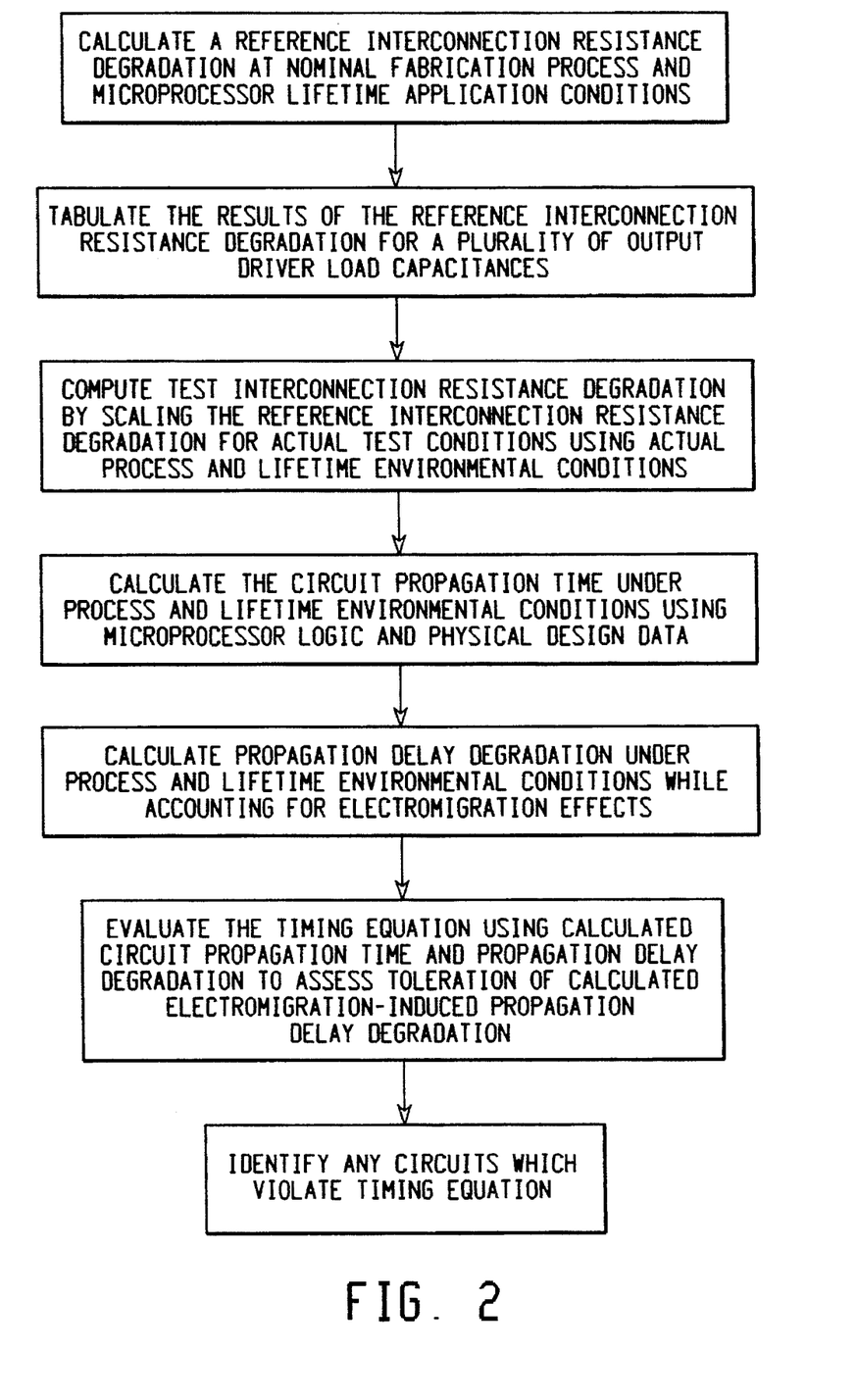
FIGS. 2 and 3 are flowcharts defining methods for assessing microprocessor tolerance to withstand circuit propagation delay degradation caused by EM and the hot electron effect, respectively.
Figure 3:
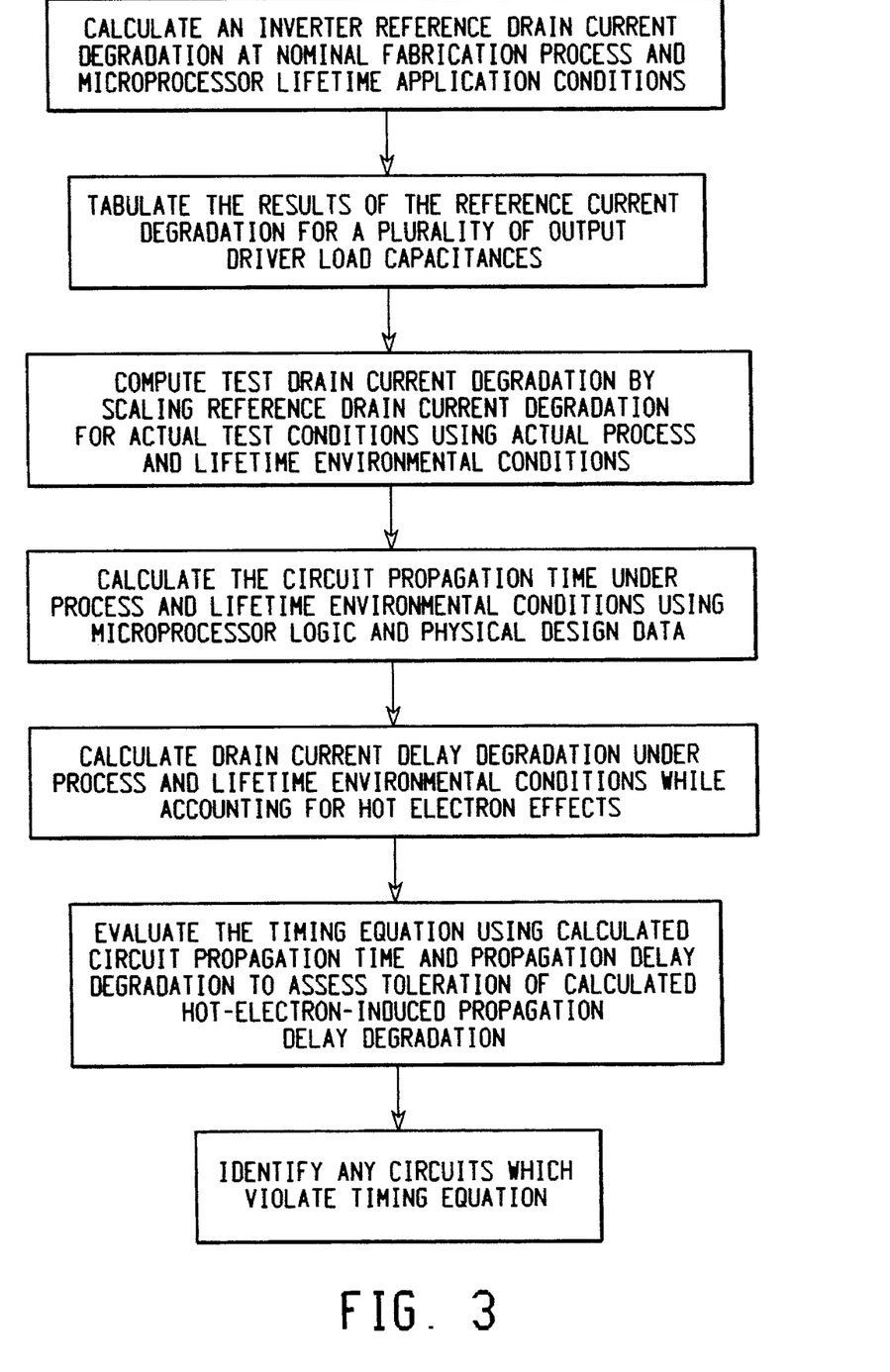

The following procedures, as described below with respect to the flow charts of FIGS. 2 and 3, outline the manner in which the tolerance of a microprocessor to withstand circuit propagation time degradation $\Delta t_{pd}(\tau)$ is assessed [for degradation caused by both electromigration and hot electron effects.

Assessment of EM Induced Propagation Degradation

In order to assess the propagation time degradation $\Delta t_{pd}(\tau)$ caused by electromigration effects, it is first necessary to determine the time dependent degradation in interconnection resistance, or $\Delta R_{int}(\tau)/R_{int}$. The degradation of $R_{int}$ over time equals the sum of the unipolar currents in the drain charge current path and the uni-polar currents in the drain discharge current path in the circuit of FIG. 1. Accordingly, $$\Delta R_{int}(\tau))/R_{int} = [\Delta R_{d,CHARGE}/R_{d,CHARGE}] + [\Delta R_{d,DISCHARGE}/R_{d,DISCHARGE}] \quad \{eq.2\}.$$

The time dependent interconnection resistance $$R_{int}(\tau) = R_{int} \pm \Delta R_{int}(\tau) \quad \{eq.3\},$$

where $R_{int}$ is the initial start-of-life interconnect resistance, and $\Delta R_{int}(\tau)$ represents interconnection resistance degradation of the initial start-of-life interconnect resistance which occur over time $\tau$ over microprocessor lifetime $\delta$. $R_{int}$ is known from FIG. 1. Also from FIG. 1, assuming a uniform electric field and a constant electrical conductivity $\sigma$, it can be determined that $$R_{tr} \cdot C_{load} = t_{pd} = [\text{length}/(\sigma \cdot \text{area})] \cdot C_{load} \quad \{eq.4\};$$

where conductivity $$\sigma = |e| \cdot k \cdot n/(m \cdot T_{case}) \quad \{eq.5\};$$

k, m, and n are process dependent constants; length and area are the dimensions of an interconnection segment under consideration; and ($T_{case}$) is the microprocessor case temperature in degrees Centigrade. Accordingly, from equation 5, $$\Delta t_{pd}(\tau) = \Delta R_{tr}(\tau) \cdot C_{load} \quad \{eq.6\}.$$

Both $\Delta t_{pd}(\tau)$ and $\Delta R_{int}(\tau))/R_{int}$ are dependent on manufacturing process variation, circuit design, and microprocessor application factors of temperature, voltage and lifetime. Accordingly, a reference interconnection resistance degradation may be calculated as $$\Delta R_{int,ref}(\tau)/R_{int,ref} = (\text{length/area})^k \times (T_{case})^m \times (\delta)^n \exp(-k/I_d) \quad \{eq.7\}$$

at nominal fabrication process and microprocessor lifetime application conditions, including $V_{dd}$, $T_{case}$, $t_{cycle}$, and $L_{eff}$ (effective channel length of both the PFET 16 and the NFET 18). Results of these calculations may be tabulated over a wide range of output driver load capacitances, $C_{load}$. In doing so, a circuit designer may build a family of curves for various load capacitances. These various load capacitances represent a variety of devices which may comprise the circuit 20 in FIG. 1.

The reference interconnection resistance degradation is then scaled for actual test conditions to arrive at a test interconnection resistance degradation $\Delta R_{int,test}(\tau))/R_{int,test}$ using actual process and lifetime environmental conditions and the following formula:

$$\Delta R_{int,test}(\tau)/R_{int,ref} = [\Delta R_{int}(\tau))/R_{int}] \cdot (\text{length}_{test} \cdot \text{area}_{ref})/$$
$$(\text{area}_{test} \cdot \text{length}_{ref})^k \cdot [(T_{case,test})/(T_{case,ref})]^{m \cdot (\delta_{test})/(\delta_{ref})]^n \cdot \exp[(I_{d,test} - I_{d,ref})/(I_{d,test} \cdot I_{d,ref})] \quad \{eq.8\}.$$

These environmental conditions effectively provide scaling factors which modify the reference interconnection resistance degradation reference previously computed for actual test conditions.

Now, the circuit propagation time $t_{pd}(\tau)$ and the propagation delay degradation $\Delta t_{pd}(\tau)$ may be computed under these same process and lifetime environmental conditions, and the values shown in FIG. 1. The term $t_{pd}(\tau)$ may be computed using microprocessor logic and physical design data, and the term $\Delta t_{pd}(\tau)$ is computed while accounting for electromigration effects. As shown in D. E. Moran, "Across-Chip Reliability Estimation", IEEE 1993 International Integrated Reliability Workshop Final Report, Oct. 24–27, 1993, $t_{pd,test}(\tau) = (0.4 \cdot R_{int} \cdot C_{int}) + [0.7 \cdot (R_{tr} \cdot C_{int} + R_{tr} \cdot C_{load} + R_{int} C_{load})]$ which approximately equals $(0.7 \cdot R_{tr}, 0.4 \cdot R_{int}) \cdot C_{int}$ for $$C_{load} < C_{int} \quad \{eq.9\}.$$

Once the circuit propagation time under test conditions $t_{pd,test}(\tau)$ is calculated, propagation delay degradation $\Delta t_{pd,test}(\tau)$ may be subsequently computed as $$\Delta t_{pd,test}(\tau) = \{[(\Delta R_{d,CHARGE}/R_{d,CHARGE}) \cdot (t_{on}/(t_{on}+t_{off}))] + [(\Delta R_{d,DISCHARGE}/R_{d,DISCHARGE}) \cdot (t_{on}/(t_{on}+t_{off}))]\} \cdot t_{pd,test}(\tau) \quad \{eq.10\}.$$

With reference to FIG. 1, ton occurs on a rising edge of the signal output by the signal generator 12 and thus PFET 16 is ON and NFET 18 is OFF; $t_{off}$ occurs when the PFET is OFF and the NFET is ON.

Accordingly, $t_{pd,test}(\tau)$ and $\Delta t_{pd,test}(\tau)$ may be used in equation 1 to determine if the microprocessor chip 10 can tolerate the calculated electromigration induced propagation degradation $\Delta t_{pd,test}(\tau)$. Circuits which are identified by this determination may be redesigned and then retested under the criteria established by equation 1: $t_{cycle} - \Sigma[t_{pd} \pm \Delta t_{pd}(\tau)] - B > 0$. The preceding steps are outlined in the flowchart of FIG. 2.

Assessment of Hot Electron Induced Propagation Degradation

In order to assess the propagation time degradation $\Delta t_{pd}(\tau)$ caused by the hot electron effect, it is first necessary to compute CMOS inverter 14 reference drain current degradation $\Delta I_{d,ref}(\tau)/I_{d,ref}$. The reference drain current degradation for the inverter equals the sum of the NFET and PFET current degradation in the circuit. Thus, $$\Delta I_{d,ref}(\tau)/I_{d,ref} = \Delta I_{d,NFET}(\tau)/I_{d,NFET} + \Delta I_{d,PFET}(\tau)/I_{d,PFET} \quad \{eq.11\}.$$

The magnitude of the reference drain current degradation $\Delta I_{d,ref}(\tau)/I_{d,ref}$ is dependent on manufacturing process variations, circuit design, and microprocessor application factors of temperature, voltage and lifetime. The NFET current degradation may be computed as $$\Delta I_{d,NFET}(\tau)/I_{d,NFET} = A \times (L_{eff})^m \times \tau_{field}^n \times \exp(-k/V_{dd}) \quad \{eq.12\},$$

Where A is the area of an interconnection segment under consideration, k, m, and n are process dependent constants, $V_{dd}$ is in volts, and $L_{eff}$ is the effective channel length of the NFET in microns. Similarly, the PFET current degradation may be computed as $$\Delta I_{d,PFET}(\tau)/I_{d,PFET} = A \times (L_{eff})^m \times \tau_{field}^n \times \exp(-k/V_{dd}) \quad \{eq.13\}.$$

The reference current degradation is computed at nominal fabrication process and microprocessor lifetime application conditions, including $V_{dd}$, $T_{case}$, $t_{cycle}$, and $L_{eff}$ (effective channel length of both the PFET 16 and the NFET 18). As with the results of the interconnection resistance reference degradation, results of these current degradation calculations may be tabulated over a wide range of output driver load capacitances, $C_{load}$, so that the circuit designer may build a family of curves for various load capacitances.

Using the reference drain current degradation $\Delta I_{d,ref}(\tau)/I_{d,ref}$ from equation 11, the reference drain current degradation is then scaled for actual test conditions to arrive at a test drain current degradation $\Delta I_{d,test}(\tau)/I_{d,test}$ using actual process and lifetime environmental conditions and the following formula:

$$\Delta I_{d,test}(\tau)/I_{d,test} = [\Delta I_{d,ref}(\tau))/I_{d,ref}][(L_{eff,test})/(L_{eff,ref})]^m \cdot [(\delta_{test})/(\delta_{ref})]^n \cdot \exp[(V_{dd,test}-V_{dd,ref})/(V_{dd,test} \cdot V_{dd,ref})] \quad \{eq.14\}.$$

These environmental conditions effectively provide scaling factors which modify the drain current degradation reference previously computed for actual test conditions. Equation 14 affects microprocessor reliability because $\Delta I_{d,PFET}(\tau)/I_{d,PFET}$ increases to greater than unity over $t_{burn-in}$, while $\Delta I_{d,NFET}(\tau)/I_{d,NFET}$ decreases to less than unity over $t_{field}$. Thus, while a circuit is originally designed under the reference circuit propagation time $t_{pd}(\tau)$ factor, decreases in $t_{pd}(\tau)$ occur during $t_{burn-in}$ due to PFETs becoming faster, and increases in $t_{pd}(\tau)$ occur during $t_{field}$ due to NFETs becoming slower.

Accordingly, the circuit propagation time $t_{pd}(\tau)$ and the propagation delay degradation $\Delta_{pd}(\tau)$ is computed under these same process and lifetime environmental conditions, and the values shown in FIG. 1. The term $t_{pd}(\tau)$ may be computed using microprocessor logic and physical design data, and the term $\Delta t_{pd}(\tau)$ is computed while accounting for hot electron effects. As shown above, $$t_{pd,test}(\tau)=(0.4 \cdot R_{int} \cdot C_{int})+[0.7 \cdot (R_{tr} \cdot C_{int}+R_{tr} \cdot C_{load}+R_{int} \cdot C_{load})]$$
which approximately equals
$$(0.7R_{tr}+0.4 \cdot R_{int}) \cdot C_{int} \text{ for } C_{load}<C_{int} \quad \{eq.9\}.$$

The effect of equation 9 is that it reduces microprocessor reliability because it erodes slack.

Once the circuit drain current under test conditions $t_{pd,test}(\tau)$ is calculated, drain current degradation $\Delta t_{pd,test}(\tau)$ may be subsequently computed as:

$$\Delta t_{pd}(\tau)=[[(\Delta I_{d,NFET}/I_{d,NFET}) \cdot (t_{on}/(t_{on}+t_{off}))]+[(\Delta I_{d,PFET}/I_{d,PFET}) \cdot (t_{on}/(t_{on}+t_{off}))]] \cdot t_{pd}(\tau) \quad \{eq.15\}$$

In equation 15, $\Delta I_{d,PFET}(\tau)$ is determined from equation 13, as well as from the following equations:

$$I_{d,PFET}(\tau)=\beta \cdot_{PFET} \cdot [(V_{in}-(V_{dd}-V_t)) \cdot (V_{out}-V_{dd})-0.5(V_{out}-V_{dd})^2] \quad \{eq.16\};$$

and $$\Delta I_{d,PFET}(\tau)=\beta \cdot_{PFET} \cdot [(V_{in}-(V_{dd}-(V_t \, \Delta V_{t,PFET}))) \cdot (V_{out}-V_{dd})-0.5(V_{out}-V_{dd})^2], \text{ where } \Delta V_{t,PFET}= C \cdot t_{burn-in}^p \cdot \exp((E \cdot \beta_{PFET}^m)-(D/V_{ds,NFET})) \quad \{eq.17\}.$$

Also, in equation 15, $\Delta I_{d,NFET}(\tau)$ is determined from equation 12. Thus, $t_{pd,test}(\tau)$ and $\Delta t_{pd,test}(\tau)$ may be used in equation 1 to determine if the microprocessor chip 10 can tolerate the hot-electron induced propagation degradation $\Delta t_{pd,test}(\tau)$ (D. E. Moran, "Across-Chip Reliability Estimation", IEEE 1993 International Integrated Reliability Workshop Final Report, Oct. 24–27, 1993). Circuits which are identified by this determination may be redesigned and then retested under the criteria established by equation 1: $t_{cycle}-\Sigma[t_{pd} \pm \Delta t_{pd}(\tau)]-B>0$. The preceding steps are outlined in the flowchart of FIG. 3.

Combined Assessment of EM/Hot Electron-Induced Propagation Degradation

The present invention also provides a method wherein the microprocessor tolerance to both the hot-electron and electromigration components of the induced propagation degradation $\Delta t_{pd,test}(\tau)$ are determined in the same test.

Figure 5:
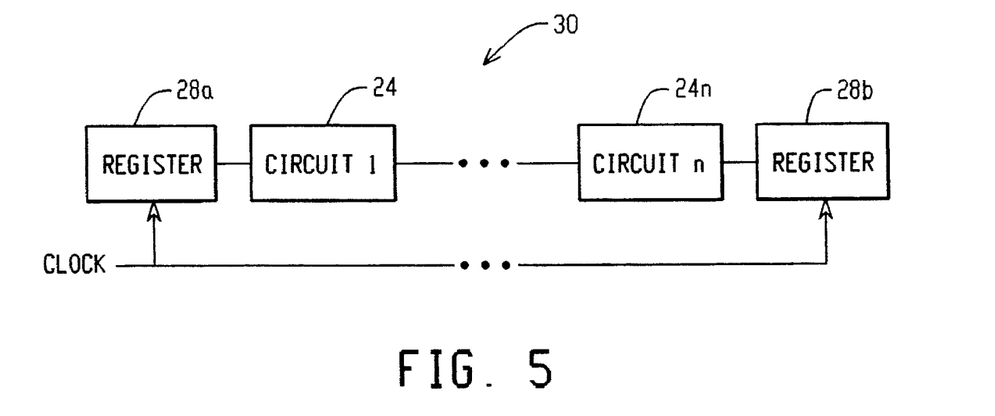
FIG. 5 is a network-level model of a plurality of circuits shown in FIG. 4 bound by registers.

Reliable microprocessor operation requires that the number of contacts and interconnect geometry across the chip may conduct the average equivalent dc current:

$$I_{dc,avg}=(\text{switching factor}/t_{cycle})\S i(t)dt \quad \{eq.18\},$$

over microprocessor lifetime $\delta$, where the magnitude of $I_{dc,avg}$ is dependent on process variation, chip design, and application factors of temperature, voltage and lifetime. The ability of a microprocessor to withstand catastrophic faults due to EM and hot electron effects is defined by the following:

$$I_{dc,avg}=C_{load} \times (dV_{load}/dt) \text{ , or approximately, } I_{dc,avg}=C_{load} \times 0.5(V_{dd}/t_{pd}), \quad (eq.19)$$

where the catastrophic reliability criteria is that:

$[I_{dc,avg}/(\text{no. of contacts})]/[I_{dc,g}/\text{contact}]<1$ for each network in the microprocessor circuit (see FIG. 5).

Figure 4:
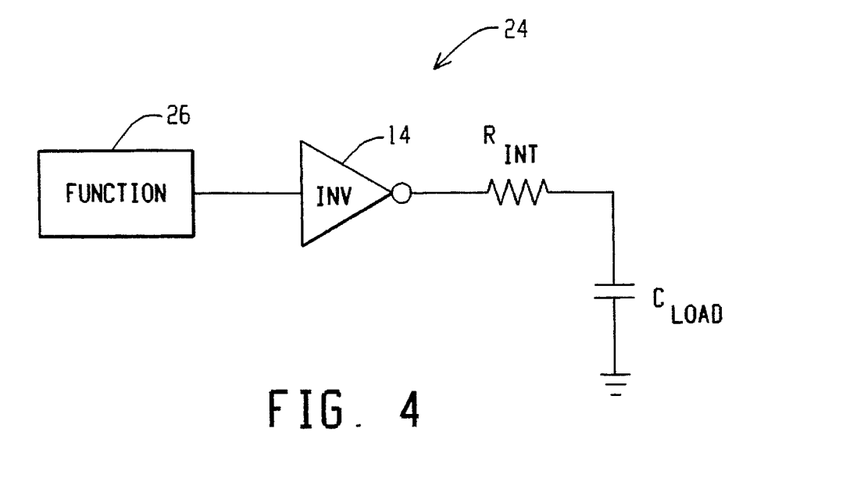
FIG. 4 is a simplified schematic circuit-level model of a circuit used in the microprocessor of FIG. 1.

Because potentially millions of transistors may reside on a single microprocessor IC chip, each circuit in the chip is modeled as shown in the circuit 24 FIG. 4 as (i) a Boolean function 26 the design of which accounts for hot electron and EM effects, (ii) an output driver such as inverter 14 having a drive capability equal to $I_{dc,avg}$, and (iii) an RC load comprising the interconnection resistance $R_{int}$ and the capacitance $C_{load}$. The values for $I_{dc,avg}$, $R_{int}$, and $C_{load}$, as well as the propagation delay $t_{pd}(\tau)$ of the actual circuit, are available in the logic timing and chip physical design data. The subsequent consequences of process variations, chip design, and application factors on the hot electron and EM effects are assumed to act only upon the inverter 14.

The entire microprocessor chip is modeled as network 30 shown in FIG. 5 as n circuit level models (FIG. 4) bounded on each end by registers 28a and 28b. Next, the IC chip is partitioned into the total number of networks 30 used in the chip design. Accordingly, the data volume associated with evaluating the above identified equations is reduced to the process of evaluating a series of simple inverter networks, and repeating this process for the number of networks in the chip.

Figure 6:
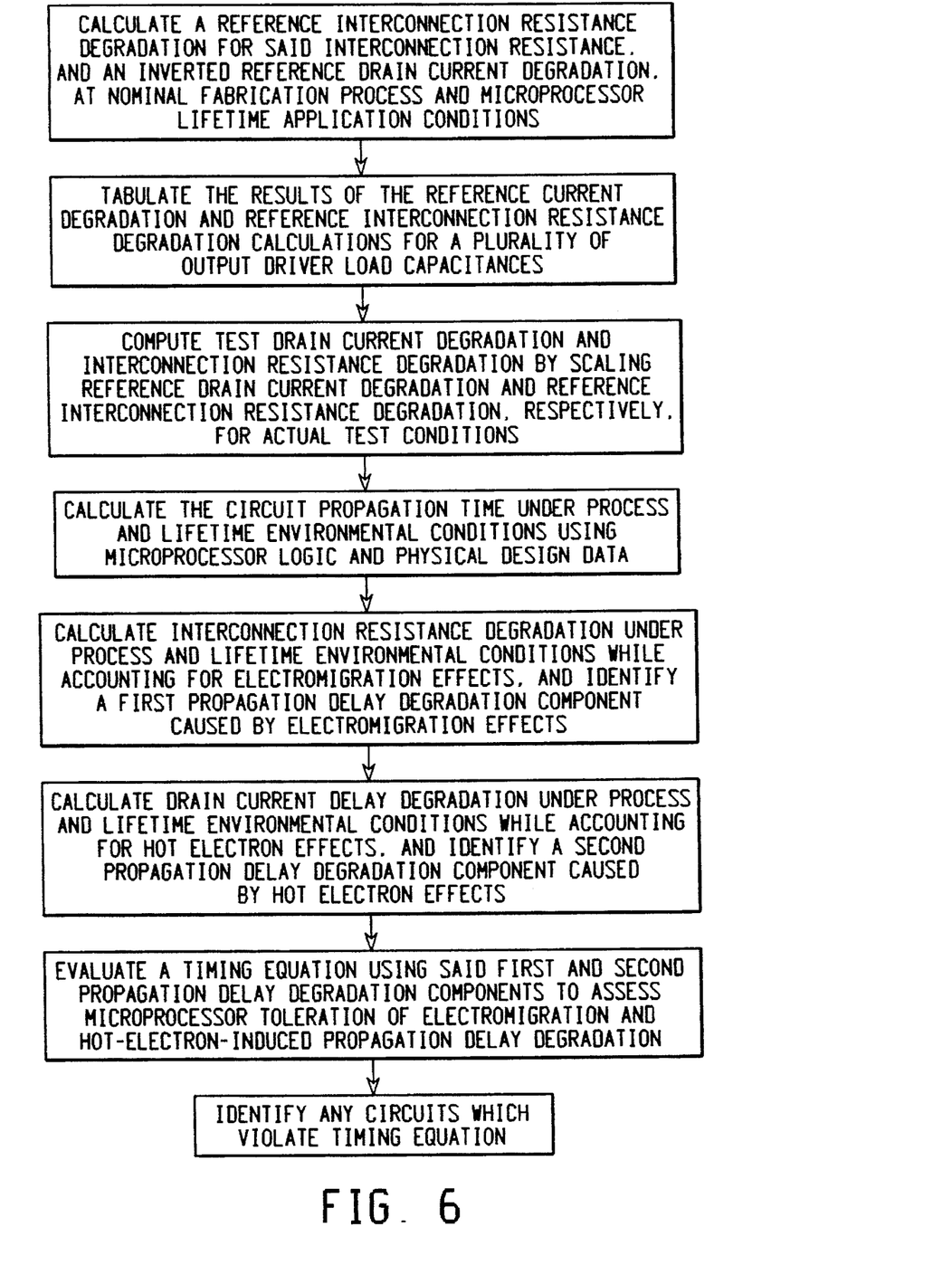
FIG. 6 is a flowchart defining a method for assessing microprocessor tolerance to withstand circuit propagation delay degradation caused by both EM and the hot electron effect.

The partitioning of the IC chip into networks 30 realistically simplifies the circuit analysis, because the inverter 14 is most susceptible to hot electron effects due to its exposure to $C_{load}$. Because the magnitude of these hot electron effects are directly proportional to device channel length ($L_{eff}$) and inversely proportional to device channel width, the sufficiency of a given circuit is evaluated based on the $C_{load}$ it sees. The logic design timing simulation for circuit cycle time $t_{cycle}$, circuit propagation delay $t_{pd}$, circuit output driver specification, and circuit load capacitance $C_{load}$ is utilized in this process. The hot electron effect is used to simulate drain current degradation $\Delta I_d(\tau)/I_d$ over a range of output driver power-levels ($V_{dd}$), output power channel lengths ($L_{eff}$), and output loads ($C_{load}$). Lastly, the system environment factors of power supply voltage ($V_{dd}$), case temperature ($T_{case}$), and lifetime $\delta$ are included in the calculations. The process steps associated with this procedure are outlined in the flowchart of FIG. 6.

Figure 7:
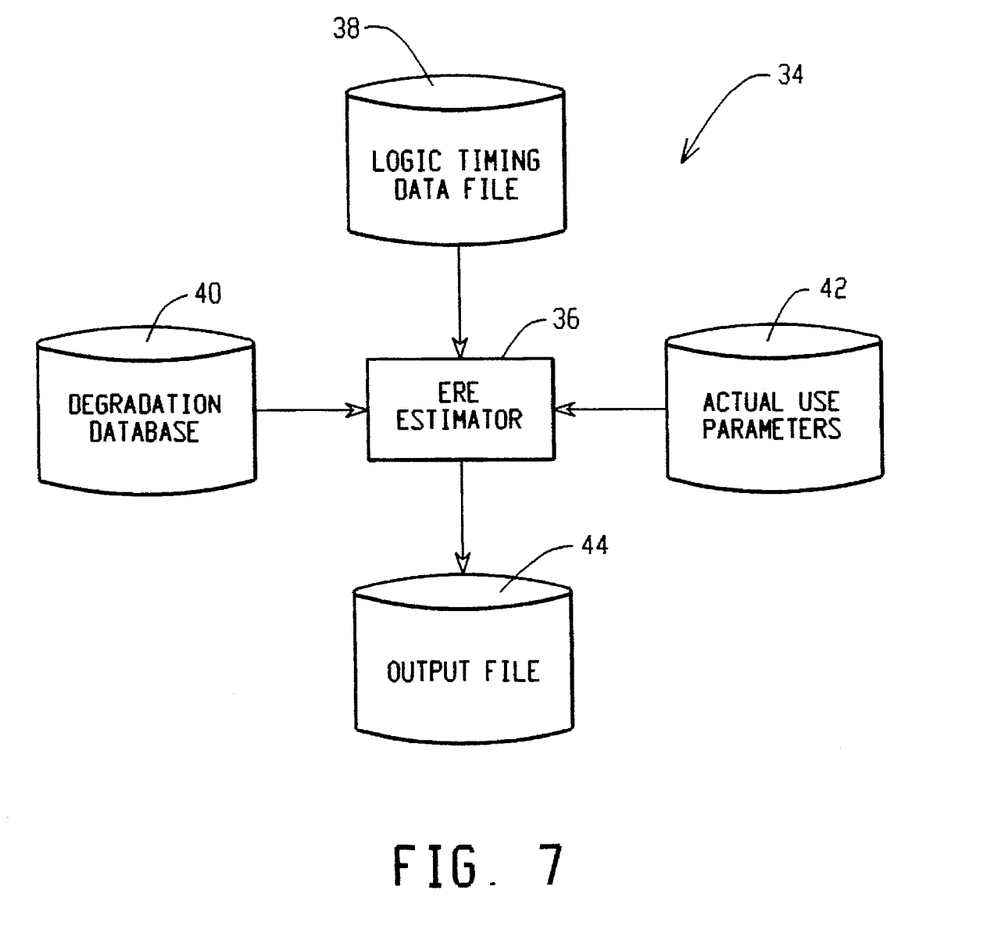
FIG. 7 is a block diagram of a system constructed according to the principles of the present invention, including an analysis tool, various input files with which the analysis tool works, and an output file created by the analysis tool.

FIG. 7 is a block diagram of a system 34 constructed according to the principles of the present invention, including an analysis tool 36, various input files 38, 40, and 42 with which the analysis tool works, and an output file 44 created by the analysis tool. As shown in FIG. 7, the input files and the output file take the form of hard disc storage, although other types of storage media are contemplated.

Input file 38 contains logic timing data taken from a logic design timing tool typically available to logic designers. The logic design timing tool creates this logic timing data based on analysis of circuit design parameters which represent the functional (timing) operation of the logic design, thereby enabling the logic designer a means of estimating the timing at the logic level (FIG. 4). Accordingly, input file 38 contains information relating to circuit inductance, $R_{int}$, $C_{load}$, $t_{pd}$, $t_{cycle}$, and B (slack information) for all register-bound networks on a chip. Such information relates to both the pre-physical and postphysical design of a microprocessor chip.

Input file 40 provides a degradation database containing information relating to the actual physical circuit design characteristics of a circuit (i.e. a physical design circuit library). This information results from timing measurements due to hot electron and EM effects, and may be provided by a commercially available physical device timing tool such as SPICE of ASTAP. The circuit-level timing tool permits circuit operation to be simulated using transistor and resistor models to determine the degradation effects which are to be expected for a particular circuit library. In this manner, a degradation database is created. The degradation database effectively calibrates the ERE analysis tool using the physical design circuit library under the expected degradation conditions.

The analysis tool 36 is termed ERE for early reliability estimator. The tool is implemented in the form of a software program which takes the logic timing data from the input file 38 and the degradation information provided by the input file 42 to calculate a reference interconnection resistance degradation for the interconnection resistance, and an inverter reference drain current degradation, under nominal fabrication process and microprocessor lifetime application conditions. The ETE tabulate these results of the reference current degradation and reference interconnection resistance degradation calculations for a plurality of output driver load conditions contained in the logic timing data file 38.

Next, the ETE computes drain current degradation and interconnection resistance degradation by scaling reference drain current degradation and reference interconnection resistance degradation, respectively, for actual test conditions using actual process and lifetime environmental conditions (actual use parameters). The scaling factors representing these actual use parameters are contained in input file 42.

Degradation of circuit propagation time contained in input file 38 is computed for each register-bound network in the microprocessor circuit (FIG. 5). Separate components of the propagation delay degradation are identified as resulting from electromigration effects, and from hot electron effects, under expected process and lifetime environmental conditions. The ETE then evaluates timing equation {1} using these propagation delay components to assess microprocessor toleration of electromigration and hot electron induced propagation delay degradation.

An output file 44 is created to store all of the information relating to drain current degradation, interconnection resistance degradation, and propagation delay degradation (i.e. a main degradation output file). Also stored is the identity of each of the circuits which violates equation {1} (i.e. a "flag" file). Other output files, of course, may be provided.

Based on the information in the output files 44, the circuit designer may either redesign the circuits which are in violation of equation {1} to provide for more slack time, or the circuit designer may slow down the speed of the chip by increasing $t_{cycle}$ so that equation {1} is satisfied. In the alternative, the circuit designer can do nothing, and merely rely upon the output files as a screening device to determine the reliability of a particular chip design.

Accordingly, the preferred embodiments of a method for assessing propagation time degradation in a microprocessor have been described. With the foregoing description in mind, however, it is understood that this description is made only by way of example, that the invention is not limited to the particular embodiments described herein, and that various rearrangements, modifications and substitutions may be implemented without departing from the true scope of the invention as hereinafter claimed.

We claim:

1. A method of assessing propagation time degradation caused by electromigration effects in a microprocessor, wherein the microprocessor comprises a plurality of logic elements including at least a first logic element connected to a second logic element by an interconnection path having a time dependent resistance, and the propagation time degradation results from changes in the resistance over time, said method comprising the steps of:

calculating a reference interconnection resistance degradation for said interconnection resistance at nominal fabrication process and microprocessor lifetime application conditions;

tabulating the results of the reference interconnection resistance degradation calculations for a plurality of output driver load capacitances, said capacitances representing a variety of possible devices which may comprise the second logic element;

computing test interconnection resistance degradation by scaling the reference interconnection resistance degradation for actual test conditions using actual process and lifetime environmental conditions;

calculating the circuit propagation time under process and lifetime environmental conditions using microprocessor logic and physical design data;

calculating propagation delay degradation under process and lifetime environmental conditions while accounting for electromigration effects;

evaluating a timing equation using calculated circuit propagation time and propagation delay degradation to assess microprocessor toleration of calculated electromigration-induced propagation delay degradation; and identifying circuits which violate said timing equation.

2. The method of claim 1, further comprising the step of redesigning and retesting identified circuits which violate said timing equation.

3. The method of claim 1, wherein said timing equation is:

$$t_{cycle} - \Sigma[t_{pd} \pm \Delta t_{pd}(\tau)] - B > 0,$$

wherein $t_{cycle}$ is a microprocessor cycle time, $t_{pd}$ is a circuit propagation time for a given interconnection path, B represents set-up, hold, and clock variation times allotted for that path, and $\Delta t_{pd}(\tau)$ is circuit propagation time degradation.

4. The method of claim 3, wherein said timing equation is evaluated for both intermittent and catastrophic faults.

5. A method of assessing propagation time degradation caused by hot electron effects in a microprocessor, wherein the microprocessor comprises a plurality of logic elements including at least a first logic element connected to a second logic element by an interconnection path having a time dependent resistance, said first logic element having a drain current, and the propagation time degradation results from changes in the drain current over time, said method comprising the steps of:

calculating an inverter reference drain current degradation at nominal fabrication process and microprocessor lifetime application conditions;

tabulating the results of the reference current degradation calculations for a plurality of output driver load capacitances;

computing test drain current degradation by scaling reference drain current degradation for actual test conditions using actual process and lifetime environmental conditions;

calculating the circuit propagation time under process and lifetime environmental conditions using microprocessor logic and physical design data;

calculating drain current delay degradation under process and lifetime environmental conditions while accounting for hot electron effects;

evaluating a timing equation using calculated circuit propagation time and propagation delay degradation to assess microprocessor toleration of calculated hot-electron-induced propagation delay degradation; and identifying circuits which violate said timing equation.

6. The method of claim 5, further comprising the step of redesigning and retesting identified circuits which violate said timing equation.

7. The method of claim 5, wherein said timing equation is $$t_{cycle} - \Sigma[t_{pd} \pm \Delta t_{pd}(\tau)] - B > 0,$$

wherein $t_{cycle}$ is a microprocessor cycle time, $t_{pd}$ is a circuit propagation time for a given interconnection path B represents set-up, hold, and clock variation times allotted for that path, and $\Delta t_{pd}(\tau)$ is circuit propagation time degradation.

8. The method of claim 7, wherein said timing equation is evaluated for both intermittent and catastrophic faults.

9. A method of assessing propagation time degradation caused by electromigration effects and hot electron effects in a microprocessor, wherein the microprocessor comprises a plurality of logic elements including at least a first logic element connected to a second logic element by an interconnection path having a time dependent resistance, said first logic element having a drain current, and the propagation time degradation results from changes in the resistance and drain current over time, said method comprising the steps of:

calculating a reference interconnection resistance degradation for said interconnection resistance, and an inverter reference drain current degradation, at nominal fabrication process and microprocessor lifetime application conditions;

calculating the results of the reference current degradation and reference interconnection resistance degradation calculations for a plurality of output driver load capacitances, said capacitances representing a variety of possible devices which may comprise the second logic element;

computing test drain current degradation and interconnection resistance degradation by scaling reference drain current degradation and reference interconnection resistance degradation, respectively, for actual test conditions using actual process and lifetime environmental conditions;

calculating the circuit propagation time under process and lifetime environmental conditions using microprocessor logic and physical design data;

calculating interconnection resistance degradation under process and lifetime environmental conditions while accounting for electromigration effects;

identifying a first propagation delay degradation component caused by electromigration effects under process and lifetime environmental conditions;

calculating drain current delay degradation under process and lifetime environmental conditions while accounting for hot electron effects;

identifying a second propagation delay degradation component caused by hot electron effects under process and lifetime environmental conditions;

evaluating a timing equation using said first and second propagation delay degradation components to assess microprocessor toleration of electromigration and hot electron induced propagation delay degradation; and identifying circuits which violate said timing equation.

10. The method of claim 9, further comprising the step of redesigning and retesting identified circuits which violate said timing equation.

11. The method of claim 9, wherein said timing equation is:

$$t_{cycle} - \Sigma[t_{pd} \pm \Delta t_{pd}(\tau)] - B > 0,$$

wherein $t_{cycle}$ is a microprocessor cycle time, $t_{pd}$ is a circuit propagation time for a given interconnection path, B represents set-up, hold, and clock variation times allotted for that path, and $\Delta t_{pd}(\tau)$ is circuit propagation time degradation.

12. The method of claim 11, wherein said timing equation is evaluated for both intermittent and catastrophic faults.

* * * * *